United States Patent [19]

Sakui et al.

[11] Patent Number: 4,819,207
[45] Date of Patent: Apr. 4, 1989

[54] HIGH-SPEED REFRESHING RECHNIQUE FOR HIGHLY-INTEGRATED RANDOM-ACCESS MEMORY

[75] Inventors: Koji Sakui, Tokyo; Shigeyoshi Watanabe, Yokohama, both of Japan

[73] Assignee: Kabushiki Kaisha Toshiba, Kawasaki, Japan

[21] Appl. No.: 99,601

[22] Filed: Sep. 22, 1987

[30] Foreign Application Priority Data

Sep. 30, 1986 [JP] Japan .................. 61-231772
Mar. 2, 1987 [JP] Japan .................. 62-46975

[51] Int. Cl.$^4$ .............................. G11C 7/00
[52] U.S. Cl. ....................... 365/222; 365/207
[58] Field of Search ............. 365/222, 207, 208, 189

[56] References Cited

U.S. PATENT DOCUMENTS 4,367,540 1/1983 Shimohigashi .................. 365/207

FOREIGN PATENT DOCUMENTS 60-253096 12/1985 Japan .

Primary Examiner—Joseph A. Popek
Attorney, Agent, or Firm—Oblon, Fisher, Spivak, McClelland & Maier

[57] ABSTRACT

A divided-bit line type dynamic random-access memory is disclosed which has parallel main bit line pairs in each of which sub-bit line pairs are provided to be electrically parallel with each other. Parallel word lines are provided on the substrate to insulatively cross the sub-bit line pairs. Memory cells are connected to crossing points of the sub-bit line pairs and the word lines. Main sense amplifiers are respectively connected to the main bit line pairs, sub-sense amplifiers are respectively connected to the sub-bit line pairs. A specific refreshing technique is utilized, according to which, when a refreshing operation is executed in a refreshing mode of the memory, the same number of word lines as that of sub-bit line pairs provided in each main-bit line pair are simultaneously selected, and the sub-sense amplifiers are activated to refresh together the memory cells which are connected to the work lines thus selected.

12 Claims, 3 Drawing Sheets

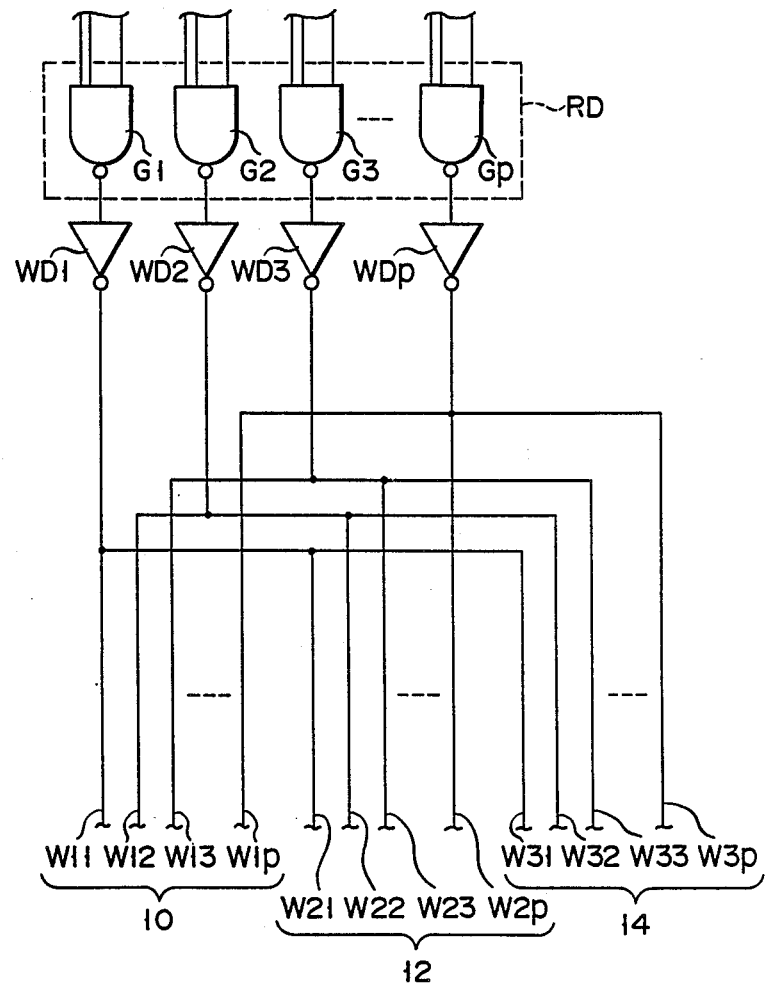
F I G. 2

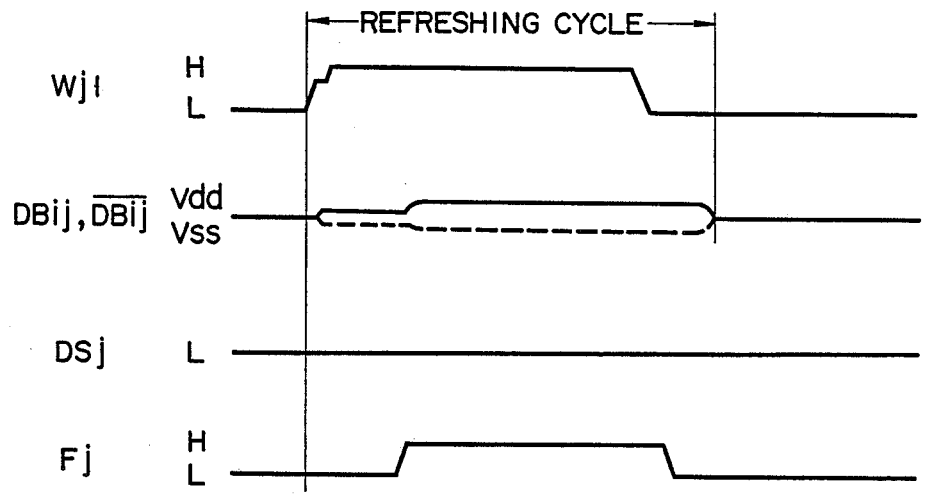
F I G. 3
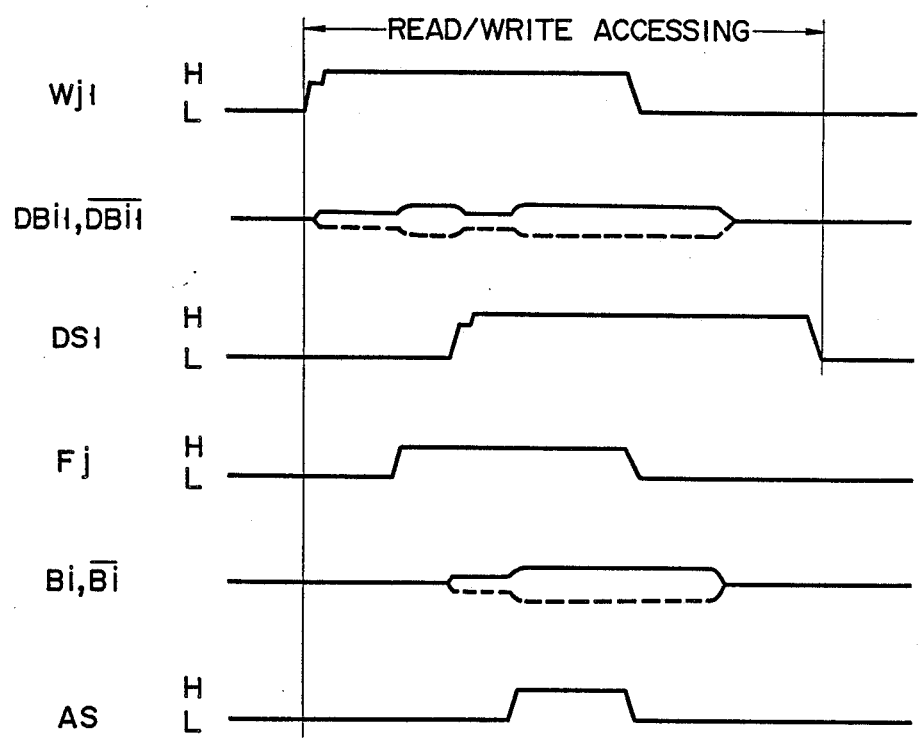
F I G. 4

HIGH-SPEED REFRESHING TECHNIQUE FOR HIGHLY-INTEGRATED RANDOM-ACCESS MEMORY

BACKGROUND OF THE INVENTION

This invention relates to semiconductor memory devices, and more particularly to a highly integrated random-access memory including a plurality of memory cells each made up of a transistor and a capacitor.

In the recent semiconductor field, need for increasing the memory capacity per chip causes progressive increase of integration density of the semiconductor memories. This trend is remarkable particularly in dynamic random-access memories (abbreviated as "dRAMs"). It may easily be understood that if the integration density is higher, it is more difficult to obtain a desired long data storage time of memory cells, because the capacitance of each memory cell capacitor decreases with increase of integration density. In the near future, the integration density of dRAMs will have 4 megabit (MB), 16 MB or more. In such dRAMs, even if a special grooved capacitor structure, called a "trench capacitor", is employed for the memory cell fabrication, the resultant memory cell capacitance is 40 fF at most. This fact implies that a desired long data storage time of the memory cells cannot be obtained.

The measure now taken for this data storage time problem is to increase the data refreshing cycle time of dRAMs. To complete the data refreshing with respect to all of the word lines, a 64 kilo-bit (KB) dRAM needs 128 data refreshing operations at the refreshing cycle of 2 ms. A 256 KB dRAM needs 256 data refreshings at the refreshing cycles of 4 ms. A 1 MB dRAM needs 512 data refreshing at 4 ms refreshing cycles. The increase of refreshing cycle time due to increase of the chip memory capacity allows the substantial data storage time of the memory cells to be long.

This approach, however, involves the problem of an unsatisfactory duty ratio of dRAMs. The problem arises from the fact that the increase of integration density of dRAMs is inevitably accompanied by the long refreshing time for all of the word lines. The term "duty ratio" of dRAMs means a ratio of the substantial access time to the entire operation time of dRAMs. This may also be defined as a difference value obtained by subtracting the refreshing or restoring time from the entire operation time. If the time necessary for refreshing all of the memory cells is long, the ratio of substantial data access time to the entire dRAM operation time, i.e., the duty ratio, is small. In actual use of dRAMs, there is a strong demand by user that the duty ratio of dRAM is set to values nearly equal to those of the current dRAM of normal integration density. The aforementioned approach cannot satisfy this user's demand.

SUMMARY OF THE INVENTION

It is therefore an object of this invention to provide a novel, improved, and highly-integrated semiconductor memory device with an improved data storage time and a satisfactory duty ratio.

In accordance with the above object, this invention is addressed to a specific semiconductor memory device, which has memory cells fabricated on a ship substrate at high integration density, each of the memory cells having a transistor and a data storing capacitive element. Parallel main bit pairs of m are formed on the substrate. Sub-bit line pairs of n are arrayed electrically parallel with each main bit line pair. These main and sub-bit line pairs thus arrayed form a "divided-bit line structure". Each of n sub-bit line pairs is connected through a transfer gate to a corresponding main bit line pair. If the transfer gate is enabled the sub-bit line pair is electrically connected to the corresponding main bit line pair.

Parallel word lines insulatively crossing the sub-bit line pair are grouped into n word line sections each including a predetermined number of word lines. Memory cells for capacitively storing data are located at the crosspoints of the sub-bit line pairs and all of the word lines. Each sub-bit line pair is provided with the same number of memory cells as that of the memory cells of the specific number of word lines, accordingly. Main sense amplifier circuits are connected to the main bit line pairs. Sub-sense amplifier circuits are connected to the sub-bit line pairs.

When the refreshing operation is performed one time in the refreshing mode of the memory device, the same number, i.e. n, or word lines as that of the sub-bit line pairs, which are provided for each main bit line pair, are simultaneously selected. Each of these selected work lines is connected to one memory cell contained in the corresponding sub-bit line pair. The sense amplifier circuits are simultaneously or sequentially activated to refresh together the memory cells connected to the selected word lines. The refreshing operation is cyclically repeated to rapidly refresh all of the memory cells provided for each main bit line pair to the last.

This invention, its object and advantages will be more apparent when reding the detailed description of the preferred embodiments in connection with the accompanying drawings.

BRIEF DESCRIPTION OF THE DRAWINGS

In the detailed description of a preferred embodiment of the invention presented below, reference is made to the accompanying drawings in which:

FIG. 2 is a circuit diagram showing a row recorder circuit connected to word lines of the dynamic random-access memory shown in FIG. 1;

FIG. 3 is a diagram showing waveforms of voltage signals which are generated on the major wiring lines of the dynamic random-access memory shown in FIG. 1, in a refreshing mode thereof; and FIG. 4 is a diagram showing waveforms of voltage signals which are generated on the major wiring lines of the dynamic random-access memory of FIG. 1, in a data reading/writing mode thereof.

DETAILED DESCRIPTION OF THE PREFERRED EMBODIMENTS

Figure 1:
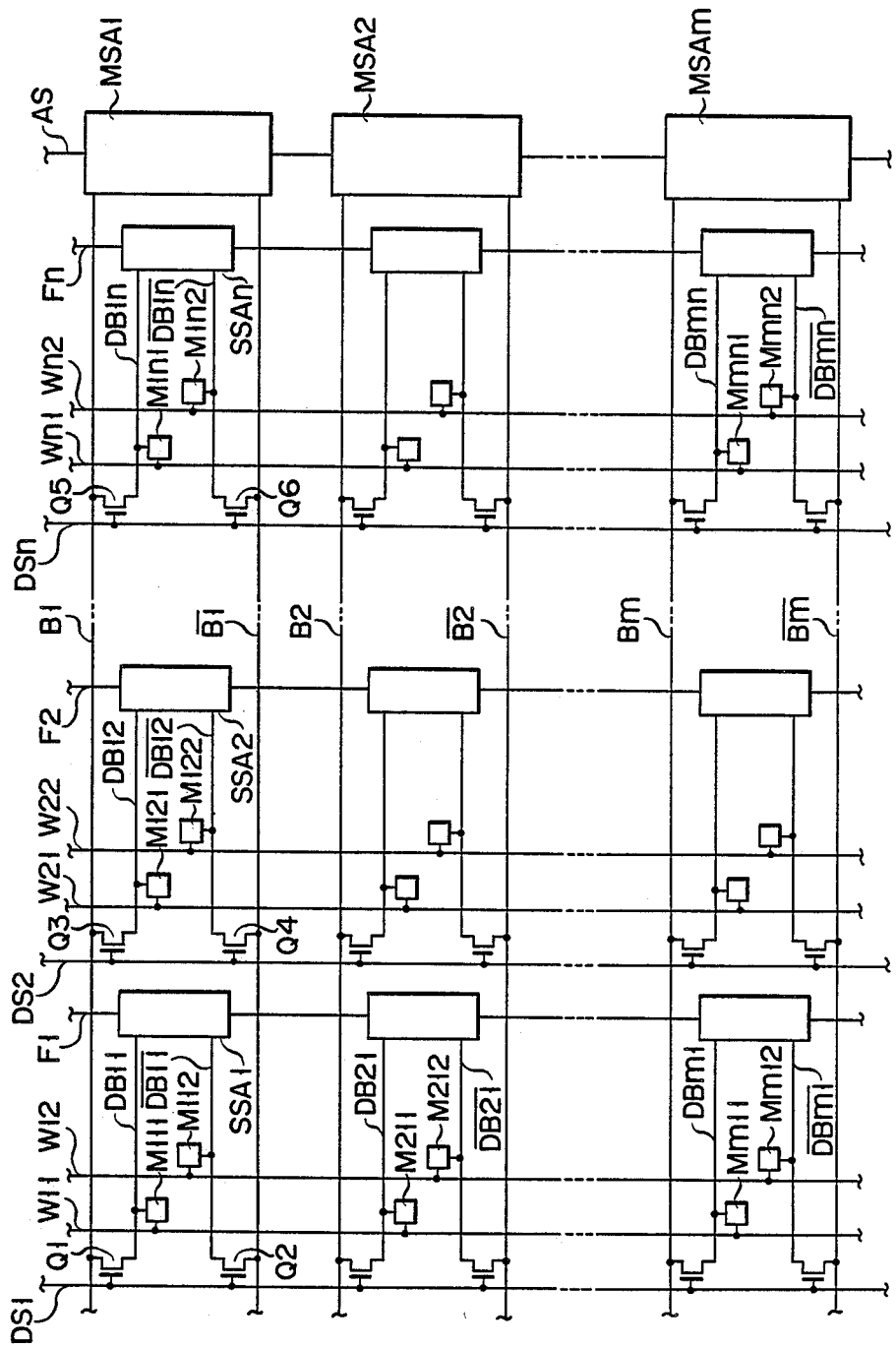
FIG. 1 is a diagram schematically showing the main portion of a divided-bit line type dynamic random-access memory according to one preferred embodiment of this invention.

Referring now to FIG. 1, a dynamic random-access memory (referred to as a "dRAM" hereinafter) has parallel bit line pairs Bi and $\overline{Bi}$ (i=1, 2, ..., m), which are provided on a semiconductor chip substrate. In FIG. 1, the substrate is omitted only for the sake of diagrammatic simplicity: if the substrate were illustrated, it would be illustrated as a rectangular block surrounding the overall circuit diagram of FIG. 1.

A predetermined number of divided-bit lines DBij and $\overline{DBij}$ (j=1, 2, ..., n: n=8, for example) are provided for each pair of bit lines Bi and $\overline{Bi}$. These divided-bit lines DBij and $\overline{DBij}$ will be called "sub-bit lines" or "sub-bit line pairs"; bit lines Bi and $\overline{Bi}$ will be referred to as "main bit lines" or "main bit line pairs". Sense amplifier circuits (hereinafter referred to as "main sense amplifiers") MAS1, MSA2, ..., MSAm are connected to main bit line pairs B1 and $\overline{B1}$, B2 and $\overline{B2}$, ..., Bm and $\overline{Bm}$, respectively.

Main sense amplifiers MSA are connected in common to a main sense amplifier select line AS, to which a main sense amplifier activation control signal is supplied. When line AS is activated, all the main sense amplifiers MSA1, MSA2, ..., MSAn are made active simultaneously. These main sense amplifiers are connected to data input/output lines of known arrangement (not shown).

Sub-bit line pairs DBij and $\overline{DBij}$ are electrically connected in parallel with each other to one corresponding main bit line pair Bi and $\overline{Bi}$, through switching transistors (e.g., MOSFETs) that serve as transfer gates. For instance, the first main bit line pair B1 and $\overline{B1}$ is provided with n sub-bit line pairs DB11 and $\overline{DB11}$, DB12 and $\overline{DB12}$, ..., DB1n and $\overline{DB1n}$, which are generally designated by "DB1j and $\overline{DB1j}$". A first sub-bit line pair DB11 and $\overline{DB11}$ is connected to main bit line pair B1 and $\overline{B1}$ through MOSFETs Q1 and Q2 serving as transfer gate therefor; a second sub-bit line pair DB12 and $\overline{DB12}$ is connected through transfer gate MOSFETs Q3 and Q4; and a n-th sub-bit line pair DB1n and $\overline{DB1n}$ is connected through transfer gate MOSFETs Q5 and Q6. MOSFETs Q1 and Q2 are connected at their gate electrodes to a first sub-bit line pair select line DS1; MOSFETs Q3 and Q4 are connected to a second sub-bit line pair select line DS2; and MOSFETs Q5 and Q6 are connected to a n-th sub-bit line pair select line DSn. When select line DS1 is designated, the transfer gate MOSFETs connected thereto are rendered conductive, so that a set of corresponding sub-bit line pairs are selected, which are respectively connected to the corresponding main bit line pairs Bi and $\overline{Bi}$. For example, when first select line DS1 is designated, sub-bit line pairs DB11 and $\overline{DB11}$, DB12 and $\overline{DB12}$, ..., DBm1 and $\overline{DBm1}$ are selected, which may be denoted generally by "DBi1 and $\overline{DBi1}$".

Sense amplifier circuits (hereinafter referred to as "sub-sense amplifiers") SSA1, SSA2, ..., SSAn are respectively provided for the sub-bit line pairs which are connected to each main bit line pair Bi and $\overline{Bi}$. As a typical example, sub-sense amplifiers SSA1, SSA2, ..., SSAn are connected to n sub-bit line pairs DB11 and $\overline{DB11}$, DB12 and $\overline{DB12}$, ..., DB1n and $\overline{DB1n}$ of the first main bit line pair B1 and $\overline{B1}$. These sub-sense amplifiers may include known flip-flop circuits. In the remaining main bit line pairs, sub-sense amplifiers are provided in the same manner as described above with respect to the first main bit line pair B1 and $\overline{B1}$: the detailed explanation therefor will thus be omitted.

The first set of parallel word lines W1k (k=1, 2, ..., p; p=128, for example) run on the substrate to be perpendicular to the first sub-bit line pairs DB11 and $\overline{DB11}$, DB21 and $\overline{DB21}$, DBm1 and $\overline{DBm1}$, which are respectively provided in main bit line pairs B1 and $\overline{B1}$, B2 and $\overline{B2}$, ..., Bm and $\overline{Bm}$, respectively. Memory cells M111, M112, ..., which may be represented generally by "M11k", are respectively provided at the crossing points of word lines W11, W12, ..., W1p and sub-bit lines DB11 and $\overline{DB11}$. Memory cells M21k are respectively provided at the crossing points of the same word lines W1k and sub-bit lines DB21 and $\overline{DB21}$. Memory cells Mm1k, i.e., Mm11, Mm12, ..., are respectively provided at the crossing points of word lines W1k and sub-bit lines DBm1 and $\overline{DBm1}$. Each memory cell M is constituted by a MOSFET and a MOS capacitor (not shown). The other sets of word lines, including the second set of word lines W2k, and the n-th set of word lines Wnk are provided in the similar manner as described above: the detailed description will be omitted only for the sake of simplification of specification.

Select lines Fj (j=1, 2, ..., n) are so provided as to be electrically connected to sub-sense amplifiers of respective columns of sub-bit line pairs: the first select line F1 is connected in common to sub-sense amplifiers of the first sub-bit line pairs DB11 and $\overline{DB11}$, DB21 and $\overline{DB21}$, DBm1 and $\overline{DBm1}$; the second select line F2 is connected to sub-sense amplifiers of the second sub-bit line pairs DB12 and $\overline{DB12}$, ...; and the n-th select line Fn in connected to sub-sense amplifiers of the n-th sub-bit line pairs DB1n and $\overline{DB1n}$, ..., as shown in FIG. 1. These lines F serve as sub-sense amplifier select lines, to which an activation control signal is supplied. When one of these select lines F1, F2, ..., Fn is activated in response to the activation control signal, the corresponding sub-sense amplifiers connected thereto are simultaneously rendered active to perform a sensing operation.

A row decoder circuit RD is provided which performs a word line selecting operation. Row decoder circuit RD includes NAND gates Gk (k=1, 2, ..., p), the number of which corresponds to that of one section of word lines (W11, W12, ..., W1p, for example) provided for a sub-bit line pair (DB11 and $\overline{DB11}$), which is selected from among n sub-bit line pairs provided in a main bit line pair (B1 and $\overline{B1}$, for example). Let it be shown one typical example, wherein the dRAM is a 1 MB memory. In this case, the total number of word lines Wjk necessary for each pair of main bit lines is 1,024. When 8 sub-bit line pairs are provided for each main bit line pair, that is, the number n is 8, then these word lines are divided into 8 sections, each of which consists of 128 word lines, that is the number p is 128. Under such a condition, the total number of NAND gates G to be included in row decoder RD is "128", which is only ⅛ of the total number of word lines W.

NAND gates G1, G2, ..., Gp, which may be designated generally by Gk, are connected through word line drivers WD1, WD2, ..., WDp, which may be denoted generally by WDk, to word lines W in such a manner that one NAND gate Gk is connected in common to k-th word lines W1k, W2k, W3k of n sections of word lines, each section of which is connected to the corresponding sub-bit line pair included in each main bit line pair. In FIG. 2, reference numeral "10" is used to designate the first set of word lines W11, W12, W13, ..., W1p; "12" the second set of word lines W21, W22, W23, ... W2p; "14" the third set of word lines W31, W32, W33, ..., W3p. First NAND gate G1 is connected through driver WD1 to word lines W11, W21, W31, ... respectively included in word line sets 10, 12, 14, ...; second NAND gate G2 is connected to word lines W12, W22, W32; third NAND gate G3 is to word lines W13, W23, W33.

When one NAND gate, G1, for example, is designated, word line driver WD1 is rendered active so that word lines W11, W21, W31, ... are selected and activated simultaneously. When another NAND gate G2 is then designated, word line driver WD2 is rendered active to cause word lines W12, W22, W32, ... to be activated simultaneously. In this manner, when any one of NAND gates G are sequentially designated, different n word lines ("n" is 8 in 1 MB dRAM as described above) are activated at the same time.

The data refreshing operation of the divided-line type dRAM will be described referring to FIGS. 3 and 4.

When the activating operation of the dRAM starts, the line select control signals supplied to sub-bit line select lines DS1, DS2, ..., DSn have all logic "LOW" level, as shown in FIG. 3. All of the MOSFETs Q1, Q2, ... serving as the transfer gates for the sub-bit line pairs are made conductive by the "LOW" level control signals. All of divided type bit line pairs DB11 and $\overline{DB11}$, ..., DBmn and $\overline{DBmn}$ are electrically disconnected from main bit line pairs B1 and $\overline{B1}$, ..., Bm and $\overline{Bm}$.

Subsequently, a row address signal is input to the dRAM to simultaneously select n word lines by row decoder RD. These n word lines first selected are those as selected one by one from n sets of word lines for n sub-bit line pairs DBij and $\overline{DBij}$, which are provided for each main bit line pair Bi and $\overline{Bi}$, and those are denoted as W11, W21, ..., Wn1, for example. In synchronism with the simultaneous selection of n word lines W11, W12, ... Wn1, sub-sense amplifier select lines F1, F2, ..., Fn are activated together (see FIG. 3). Sub-sense amplifiers SSA1, SSA2, ..., SSAn for each main bit line pair are simultaneously made active. These sub-sense amplifiers execute the sensing operations for the corresponding sub-bit line pairs, respectively. Since the sub-sense amplifiers are made up of flip-flop circuits as early mentioned, each sub-bit line pair, which is precharged to have the potential at Vdd/2, has either of two different power source voltages Vdd and Vss depending on the stored data of the memory connected to a specified word line. (In FIG. 3 illustrating potential variations of on bit line pair DBij and $\overline{DBij}$, continuous line shows the potential variation of DBij and a broken line the potential variation of $\overline{DBij}$.) The power voltages denoted as Vdd and Vss are a drain power voltage and a source power voltage. Under this condition, data restoring or refreshing operation is simultaneously applied to m×n memory cells connecting to those simultaneously selected word lines W11, W21, ..., Wn1 of n, more exactly, to memory cells M111, M211, ..., Mm11 coupled with word line W11, memory cells M121, M221, ..., Mm21 coupled with word line W21, and memory cells M1n1, M2n1, ..., Mmn1 coupled with word line Wn1, which may be denoted generally by "Mi11, Mi21, ..., Min1", or "Mij1".

In the refreshing mode in which a column address signal is not supplied to the dRAM during this refreshing, such as "RAS only refreshing" period, "CAS before RAS refreshing", "auto-refreshing" or the like, those selected word lines W11, W21, ..., Wn1 have the initial potential again, to complete one refreshing operation, which is known as "one cycle of refreshing operation".

In the data writing/reading mode or accessing mode in which the column address signal is supplied during this refreshing period, when the column address signal is supplied to the dRAM after the memory cells are restored, the row address signals are released from the latched state, and one sub-bit select line, for example, DS1, is selected as shown in FIG. 4. The transfer gate transistors including Q1 and Q2 connected to the selected select line DS1 are rendered conductive, so that the potential representing the stored data of memory cells M111, M211, ..., Mm11, which may be designated generally by "M11", appear on sub-bit line pairs DB11, DB21, ..., DBm1, which may be represented generally by DBi1. The potential data of those sub-bit line pairs DBi1 are transferred through conductive transfer gates to the corresponding main bit lines Bi, respectively. When a main sense amplifier activation signal is supplied to an activation control line AS as shown in FIG. 4, main sense amplifiers MASi are made active to determine whether the logic level on each main bit line is logic "HIGH" or "LOW". In this case, although n word lines W11, W21, ... are selected simultaneously, signal charges are actually transferred between the sub-bit lines and the main bit lines with respect to only an array of memory cells connected to one word line. Subsequently, at least one main bit line pair as designated by the column address signal becomes electrically conductive to known input/output lines (not shown). This results in the operation for reading out or writing the data.

It should be noted that in the precharge mode following the data refreshing or reading/writing mode, selected lines DSj are designated to enable all of the transfer gates. All of the sub-bit line pairs are made electrically conductive to the corresponding main bit line pairs, respectively. When the refreshing operation, or data reading/writing operation starts, all of the transfer gates are temporarily rendered nonconductive, all of the bit line pairs are electrically disconnected from the corresponding bit line pairs, respectively. Thereafter, if necessary, select lines DSj are controlled so that only desired transfer gates are enabled.

In the dRAM with the divided-bit line structure as mentioned above, to execute one activating operation, or "one refreshing cycle", the simultaneous activation is respectively applied to the n word lines, which are those selected one by one by n sub-bit line pairs provided for each main bit line pair (viz., the number of the selected word lines is equal to that of the sub-bit line pairs provided for each main bit line pair). For example, n word lines W11, W21, ..., Wn1 are first selected simultaneously, word lines W12, W22, ..., Wn2 are then selected simultaneously, and the simultaneous selection of the subsequent word lines are repeated in this way. Therefore, the time necessary for refreshing all of the memory cells, that is, the refreshing period, is reduced 1/n that of the prior dRAM in which one cycle of refreshing operation is performed every word line. It is evident that if this refreshing technique is applied for the highly integrated dRAMs, a ratio of the refreshing time to the overall operation time can be reduced, and hence the duty ratio of the dRAM can be improved. This provides a satisfactory solution to the contradictive propositions to set the data storage time of microfabricated memory cells with minute capacitance to a desired value and to improve the duty ratio.

Typical numerical data of the 1 MB dRAM will be given below to prove the refreshing time improvement of the dRAM by this invention. In the 1 MB dRAM, 1,024 memory cells are coupled with each main bit line pair. To complete the refreshing of all of the memory cells of each main bit line pair, the conventional data refreshing technique needs 1,024 refreshing cycles, because one word line is selected for one refreshing cycle. At least 200 nsec is taken for one refreshing cycle, and 204.8 msec are needed for refreshing all of the memory cells.

The refreshing time of the dRAM according to this invention follows. In the dRAM used, wherein 8 sub-bit line pairs each including 128 memory cells are provided for each main bit line pair, and each main bit line pair contains 1,024 memory cells, to complete the refreshing of all of the memory cells of one main bit pair, only 128 refreshing operations are needed since eight bit lines are selected simultaneously for one activating operation. Therefore, the entire refreshing time for refreshing all of the memory cells is only 26.6 msec: $\frac{1}{8}$ the refreshing time of the conventional technique.

Additionally, this invention can simplify the arrangement of the row decoder circuit to select and drive the word lines. The reason for this is that, since n word lines are simultaneously selected for one activating operation, the number of drivers provided for the row decoder can be reduced to 1/n. This fact greatly contributes to (1) saving the chip substrate area of dRAM, (2) further improvement of the integration density of dRAM, and (3) reduction of the power consumption of dRAM.

Although the invention has been described with reference to a specific embodiment, it shall be understood by those skilled in the art that numerous modifications may be made that are within the spirit and scope of the invention.

The dRAM as discussed above is arranged such that through the activating operation and the data reading/writing operation, the word lines are selected so as to always have the same number as that of the sub-bit line pairs provided for each main bit line pair (i.e., n). Alternatively, the n word lines selection may be only in the refreshing operation mode. In this modification, upon detection of the start of refreshing operation, all of the sub-bit line pairs are temporarily disconnected from the main bit line pairs, to render operative the refreshing row address counter circuit contained in the chip substrate. The row address counter designates a total of n word lines W11, W21, ..., Wn1, which are those selected one by one for the sub-bit line pairs of each main bit line pair. In the FIG. 1 circuit configuration, the designated word lines are Q11, W21, ..., Wn1.

Upon start of the data reading/writing operation, the known input address controller provided outside the dRAM substrate selects one word line from all of the word lines. For example, if word line W11 is selected, activation control line F1 of an array sub-sense amplifiers SSA1, activate these sub-sense amplifiers SSA1, ... After completion of the sensing operation of the divided-bit lines, sub-bit line select line DS1 is designated, and the signal charges representative of the stored data of memory cells M111, M211, ..., Mm11 are transferred to main bit lines B1, B2, ..., Bm via currently enabled transfer gates. Subsequently, main sense amplifiers MSAi are activated as in the previous case, to check the logic level of the stored data.

Subsequently, the refreshing operation based on the simultaneous selection of n word lines is successively repeated for each unit of m×n memory cells, realizing the short time refreshing of all of the memory cells.

In the above-mentioned embodiment, a plurality of word lines are simultaneously selected in the activation mode. The sub-sense amplifiers are all activated. In a possible modification, these sub-sense amplifiers are sequentially activated at a time interval. This effectively controls the peak current and the current changing rate in one activating operation.

While in the embodiment of this invention, the bit line pairs and the divided-bit line pairs are precharged to ($\frac{1}{2}$)Vdd, the invention is effective when it is applied for the precharge of them to Vdd. The invention is also applicable for the dRAMs with dummy cells, although the dummy cells have not been referred to in the above description. The main bit line sense amplifiers and the divided bit line sense amplifiers, which are used in the dRAM according to this invention, may be of the normal flip-flop type, the CMOS structure, the transistor-CMOS combination, called BICMOS type, and the like.

As recalled, in the dRAM according to the invention, the row address signals are unlatched when the memory cells are refreshed in the read/write mode and the column address signals are entered into the chip circuitry. Under this condition, if necessary, the divided-bit line may be selected before the refreshing operation is not completed. In the case of the main bit line sense amplifiers of the BICMOS structure whose input and output lines are separated, the column address signals may be entered prior to the row address signals. In this case, the row address signal to select the divided-bit line select signal is not latched, and when the row address signal is input, the divided-bit line select signal is selected almost simultaneously with the selection of the word lines.

What is claimed is:
1. A dynamic semiconductor memory device having a substrate, said device comprising:
   (a) parallel main bit line pairs formed on the substrate, said main bit line pairs including a certain main bit line pair;
   (b) sub-bit line pairs connected to said certain main bit line pair;
   (c) parallel word lines provided on the substrate to insulatively cross respective of said sub-bit line pairs;
   (d) memory cells for capacitively storing information, said memory cells being connected to crossing points of said sub-bit line pairs and said work lines;
   (e) first sense amplifier circuits respectively connected to said sub-bit line pairs;
   (f) second sense amplifier circuits respectively connected to said main bit line pairs; and
   (g) control means, connected to said sub-bit line pairs and said first sense amplifier circuits, for, when a refreshing operation is executed in a refreshing mode of said memory device, selecting simultaneously a plurality of word lines which are associated with different sub-bit lines, for activating said first sense amplifier circuits, and for refreshing together memory cells which are connected to the word lines thus selected.

2. The device according to claim 1, wherein said control means selects, at the same time, the same number of word lines as that of said sub-bit line pairs, each of the selected word lines being connected to a memory cell included in one corresponding sub-bit line pair and being subjected to the refreshing operation together with other memory cells thus selected simultaneously.

3. The device according to claim 2, wherein said control means comprises:
   transfer gate means connected between said sub-bit line pairs and said main bit line pairs, for being voltage-controlled to perform a switching operation, thereby electrically disconnecting said sub-bit line pairs from said certain main bit line pair, during the same number of word lines as that of said sub-bit line pairs are selected simultaneously.

4. The device according to claim 2, wherein, even in a reading/writing mode of said memory device, said control means selects, for a single data restoring operation, the same number of word lines as that of said sub-bit line pairs including a word line which is connected to a memory cell under accessing, whereby memory cells connected to the selected word lines are subjected simultaneously to the data rewriting operation.

5. The device according to claim 3, wherein said control means selects, in a reading/writing mode of said memory device, a specific word line connected to a memory cell under accessing, which cell is then subjected to a data rewriting operation.

6. The device according to claim 3, wherein said transfer gate means comprises unipolar transistors.

7. The device according to claim 3, wherein said control means activates simultaneously said first sense amplifier circuits during said same number of word lines as that of said sub-bit line pairs are selected simultaneously.

8. The device according to claim 3, wherein said control means activates sequentially said first sense amplifier circuits during said same number of word lines as that of said sub-bit line pairs are selected simultaneously.

9. The device according to claim 3, wherein said memory device is a random-access memory.

10. A dynamic random-access memory of divided-bit line type, said memory comprising:
 (a) a fiirst number of pairs of main bit lines;
 (b) main sense amplifiers connected respectively to said pairs of main bit lines;
 (c) a second number of pairs of sub-bit lines which are connected to each of said pairs of main bit lines through transfer gates for performing a switching operation;
 (d) a third number of word lines divided into the same number of sections as said second number, each of which sections consists of a fourth number of word lines insulatively crossing one pair of said sub-bit lines;
 (e) memory cells provided at crossing points of said sub-bit lines and said third number of word lines;
 (f) sub-sense amplifiers connected respectively to said second number of pairs of sub-bit lines; and
 (g) refreshing controller means, connected to said transfer gates, said third number of word lines and said sub-sense amplifiers, for simultaneously activating in a refreshing mode of said memory, a predetermined number of word lines which are selected by respectively designating a word line from every one of said second number of sections, said predetermined number being the same as said second number, and for making said sub-sense amplifiers active to simultaneously refresh memory cells which are included in said second number of pairs of sub-bit lines in each of said pairs of main bit lines and which are connected to said predetermined number of word lines thus selected.

11. The memory according to claim 10, wherein said refreshing controller means comprises:
 a row address decoder circuit provided on a substrate of said memory to have drivers having the same number as said second number, each of which is connected in common to correponding word lines respectively included in said second number of sections.

12. The memory according to claim 11, wherein said decoder circuit is formed on a substrate of said memory.

* * * * *